(12) United States Patent
Oda

(10) Patent No.: US 9,497,884 B2
(45) Date of Patent: Nov. 15, 2016

(54) RADAR ANTENNA AND RADAR APPARATUS

(71) Applicant: Furuno Electric Co., Ltd., Nishinomiya (JP)

(72) Inventor: Makoto Oda, Nishinomiya (JP)

(73) Assignee: Furuno Electric Co., Ltd., Nishinomiya (JP)

( * ) Notice: Subject to any disclaimer, the term of this patent is extended or adjusted under 35 U.S.C. 154(b) by 214 days.

(21) Appl. No.: 14/086,755

(22) Filed: Nov. 21, 2013

(65) Prior Publication Data

US 2014/0140002 A1 May 22, 2014

(30) Foreign Application Priority Data

Nov. 22, 2012 (JP) ................. 2012-256723

(51) Int. Cl.
| | | |
|---|---|---|
| H05K 7/20 | (2006.01) | |
| H01Q 1/02 | (2006.01) | |
| H01Q 1/34 | (2006.01) | |
| H01Q 3/04 | (2006.01) | |
| G01S 13/93 | (2006.01) | |
| G01S 7/02 | (2006.01) | |

(52) U.S. Cl.
CPC ............ *H05K 7/20009* (2013.01); *H01Q 1/02* (2013.01); *H01Q 1/34* (2013.01); *H01Q 3/04* (2013.01); *G01S 13/9307* (2013.01); *G01S 2007/027* (2013.01)

(58) Field of Classification Search
CPC ........................... H05K 7/20009; H01Q 1/34
See application file for complete search history.

(56) References Cited

U.S. PATENT DOCUMENTS

| | | | | |
|---|---|---|---|---|
| 7,129,908 B2 * | 10/2006 | Edward | ................. | H01Q 1/02 343/877 |
| 7,528,613 B1 * | 5/2009 | Thompson | ............ | G01S 13/953 324/637 |
| 2006/0120043 A1 * | 6/2006 | Wolford | ............... | H05K 1/0272 361/695 |
| 2008/0100523 A1 * | 5/2008 | Kim | ........................ | H01Q 1/28 343/757 |
| 2010/0066617 A1 * | 3/2010 | Alberding | ............... | G01S 7/032 343/713 |
| 2010/0245179 A1 * | 9/2010 | Puzella | .................... | H01Q 1/02 343/702 |
| 2013/0009805 A1 * | 1/2013 | Miyagawa | ......... | H01Q 13/0233 342/179 |

FOREIGN PATENT DOCUMENTS

| | | |
|---|---|---|
| EP | 2375492 A1 | 10/2011 |
| JP | S55112907 U | 8/1980 |
| JP | H0487402 A | 3/1992 |
| JP | H07014677 U | 3/1995 |
| JP | H09167916 A | 6/1997 |
| JP | 2001217728 A | 8/2001 |
| JP | 2007142074 A | 6/2007 |
| WO | 2009058651 A1 | 5/2009 |

OTHER PUBLICATIONS

Adrian, Odile, "M3R Aesa Technology for Extended Air Defence" Radar Conference 2008, IEEE, Piscataway, NJ, May 26, 2008, 6 pages.
European Patent Office, Extended European Search Report of EP13191979.7, Dec. 11, 2014, Germany, 8 pages.

* cited by examiner

*Primary Examiner* — David M Sinclair
*Assistant Examiner* — Robert Brown
(74) *Attorney, Agent, or Firm* — Alleman Hall McCoy Russell & Tuttle LLP

(57) ABSTRACT

A radar antenna is provided. The radar antenna includes an antenna body, a housing housing a plurality of components for controlling the antenna body, and a ventilation path formed in a predetermined ventilating direction and penetrating the housing. One or more of the plurality of components are disposed inside the housing to be separated from the rest of the components with respect to the ventilation path therebetween.

20 Claims, 5 Drawing Sheets

RADAR ANTENNA AND RADAR APPARATUS

CROSS-REFERENCE TO RELATED APPLICATION(S)

This application claims priority under 35 U.S.C. §119 to Japanese Patent Application No. 2012-256723, which was filed on Nov. 22, 2012, the entire disclosure of which is hereby incorporated by reference.

TECHNICAL FIELD

The present invention relates to a heat release structure of a radar antenna.

BACKGROUND

A typical radar antenna includes an antenna body that is a radiation conductor, and also include a drive source (e.g., electric motor) for rotatably driving the antenna body in the horizontal plane. Moreover, the antenna includes a gear box covered by a housing so that the drive source is not exposed outside.

A general radar antenna is provided with an oscillation source (magnetron) inside the housing of the gear box. Since a general drive source and a general oscillation source produce heat, heat easily accumulates inside the housing.

Moreover, for a radar apparatus, a configuration for accommodating a circuit board for signal processing inside the housing of the gear box has been proposed in recent years. This circuit board is mounted with a CPU for performing predetermined signal processing on signals received by the antenna. By accommodating the circuit board inside the housing of the gear box, there is no need for disposing the circuit board separately from the antenna, and the modularization of the radar antenna can be promoted.

However, since the CPU on the circuit board is a heat generating body, when the circuit board is disposed inside the housing, the problem that the heat easily accumulates inside the housing becomes more severe. Especially, since CPUs are sensitive to heat and there is a high possibility of failure due to the heat or thermal runaway, some sort of countermeasure is required to cool inside the housing.

For this, a configuration for attaching heat release members, such as fins, to an outer surface of the housing of the gear box can be considered. However, in this case, work of attaching the heat release members outside the housing will be required and, additionally, each of the heat generating bodies, such as the drive source, the oscillation source, and the CPU, needs to be attached to the heat release members from inside the housing. Thus, the gear box will be extremely difficult to assemble.

Moreover, since radar antennas are disposed at a high position in many cases, they relatively easily stand out. Therefore, the design thereof is also important. However, since there have been many cases where the design of heat release members, such as fins, is not preferable, the heat release members are avoided from being disposed to the outer surface of the housing of the gear box as much as possible.

For these reasons, it has been desired to efficiently release the heat inside the housing without providing the heat release member, such as fins, to the outer surface of the gear box.

In this regard, JP1992-087402A discloses a configuration including an attaching stand having an air passing duct, an antenna panel supporting stand attached to the attaching stand and for supporting an antenna panel to be spaced from the attaching stand, and a radome covering the antenna panel. In JP1992-087402A, the heat generated by the antenna panel is transmitted from the antenna panel supporting stand to the attaching stand so as to be released by the air passing inside the duct of the attaching stand.

However, JP1992-087402A relates to the heat release of a fixed antenna dedicated to reception, and not to the heat release from a gear box for rotatably driving a radar antenna. Also, with the configuration of JP1992-087402A, since the duct is exposed outside, the design of the entire antenna is degraded.

SUMMARY

The present invention is made in view of the above situations, and mainly aims to improve a heat release ability of a radar antenna without sacrificing the easiness in attaching components and the design of the radar antenna.

One aspect of the present invention provides a radar antenna. The antenna includes an antenna body, a housing, and a ventilation path. The housing accommodates a plurality of components for controlling the antenna body. The ventilation path is formed in a predetermined ventilating direction and penetrates the housing. One or more of the plurality of components are disposed inside the housing to be separated from the rest of the components with respect to the ventilation path therebetween.

By forming the ventilation path penetrating the housing as above, heat from the components disposed inside the housing can be released efficiently. Since heat release members are not required to be attached outside the housing, the assembling of the radar antenna is easy. Moreover, by separately disposing the plurality of components with respect to the ventilation path therebetween, heat from one or more of the plurality of components is not easily transmitted to the other components disposed separately. Thus, the components sensitive to heat can be protected.

The plurality of components may include a heat generating body and one or more non-heat generating bodies. The heat generating body may be disposed separately from at least one of the one or more non-heat generating bodies with respect to the ventilation path therebetween.

By disposing the ventilation path between the heat generating body and the at least one of the one or more non-heat generating bodies, the heat from the heat generating body does not easily influence the at least one of the one or more non-heat generating bodies.

The plurality of components may at least include a first heat generating body and a second heat generating body. The first heat generating body may be disposed separately from the second heat generating body with respect to the ventilation path therebetween.

Thus, heat from the first heat generating body does not easily influence the second heat generating body.

The radar antenna may also include a frame to which the plurality of components are attached. The ventilation path may include a ventilation section formed by the frame, and a ventilation hole formed in the housing and communicating with the ventilation section.

As described above, the respective components are attached to the frame. Therefore, the assembling of the radar antenna is easy. Moreover, since the ventilation section is disposed inside the housing, the visibility of the ventilation section from outside is low. Thus, degradation of the design of the radar antenna can be prevented.

The first heat generating body may be an oscillation element, and the second heat generating body may be a heating element disposed on a circuit board for signal processing.

Specifically, since the heating element (CPU, RAM, etc.) on the circuit board is sensitive to heat, they easily receive negative influence from the heat of the oscillation element (magnetron). Therefore, the heating element and the oscillation element are disposed with respect to the ventilation section therebetween. Thus, the influence given to the heating element (CPU, RAM, etc.) by the heat of the oscillation element can be reduced.

The ventilation path may be formed into a rectangular duct-like shape. The circuit board may be disposed parallel to an outer circumferential surface of the rectangular duct-like ventilation path.

By disposing the outer circumferential surface of the ventilation path parallel to the circuit board, the heat of the heating element (CPU, RAM, etc.) on the circuit board can easily be transmitted to the ventilation path.

The ventilation path may be arranged so that the ventilating direction is substantially horizontal.

Thus, wind easily passes the ventilation path.

A floor face of the ventilation path may incline to be lower on one end side thereof Thus, even if water enters into the ventilation path, it can be drained by the inclination of the floor face.

The housing may have an overhanging portion protruding outward in the ventilating direction, near an upper area of an inlet of the ventilation path.

Specifically, radar antennas generally receive wind blowing up from below since they are disposed at a high position in many cases. Therefore, by forming such an overhanging portion described above to the inlet of the ventilation path, the blown-up wind can be guided into the ventilation path, and the wind can pass therethrough efficiently.

The radar antenna may be a ship radar antenna to be equipped on a ship. The ventilating direction may be parallel to front-and-rear directions of the ship.

Thus, wind can pass the ventilation path by the ship traveling.

The ventilation path may be disposed below the oscillation element, a waveguide, and a rotary drive source of the antenna body .

Specifically, since the antenna body is disposed in an upper part of the radar antenna, the oscillation element, the waveguide, and the rotary drive source are also arranged in the upper part. Therefore, by arranging the ventilation path to avoid these elements, a reasonable layout can be obtained.

Another aspect of the present invention provides a radar apparatus. The radar apparatus includes the radar antenna of the above aspect and a display unit for displaying a radar image based on signals received by the radar antenna.

By forming the ventilation path penetrating the housing as above, heat from the components disposed inside the housing can be released efficiently. Since heat release members are not required to be attached outside the housing, the assembling of the radar antenna is easy. Moreover, by separately disposing the plurality of components with respect to the ventilation path therebetween, heat from one or more of the plurality of components is not easily transmitted to the other components disposed separately. Thus, the components sensitive to heat can be protected.

BRIEF DESCRIPTION OF THE DRAWINGS

The present disclosure is illustrated by way of example and not by way of limitation in the figures of the accompanying drawings, in which the like reference numerals indicate like elements and in which.

DETAILED DESCRIPTION

Figure 1:
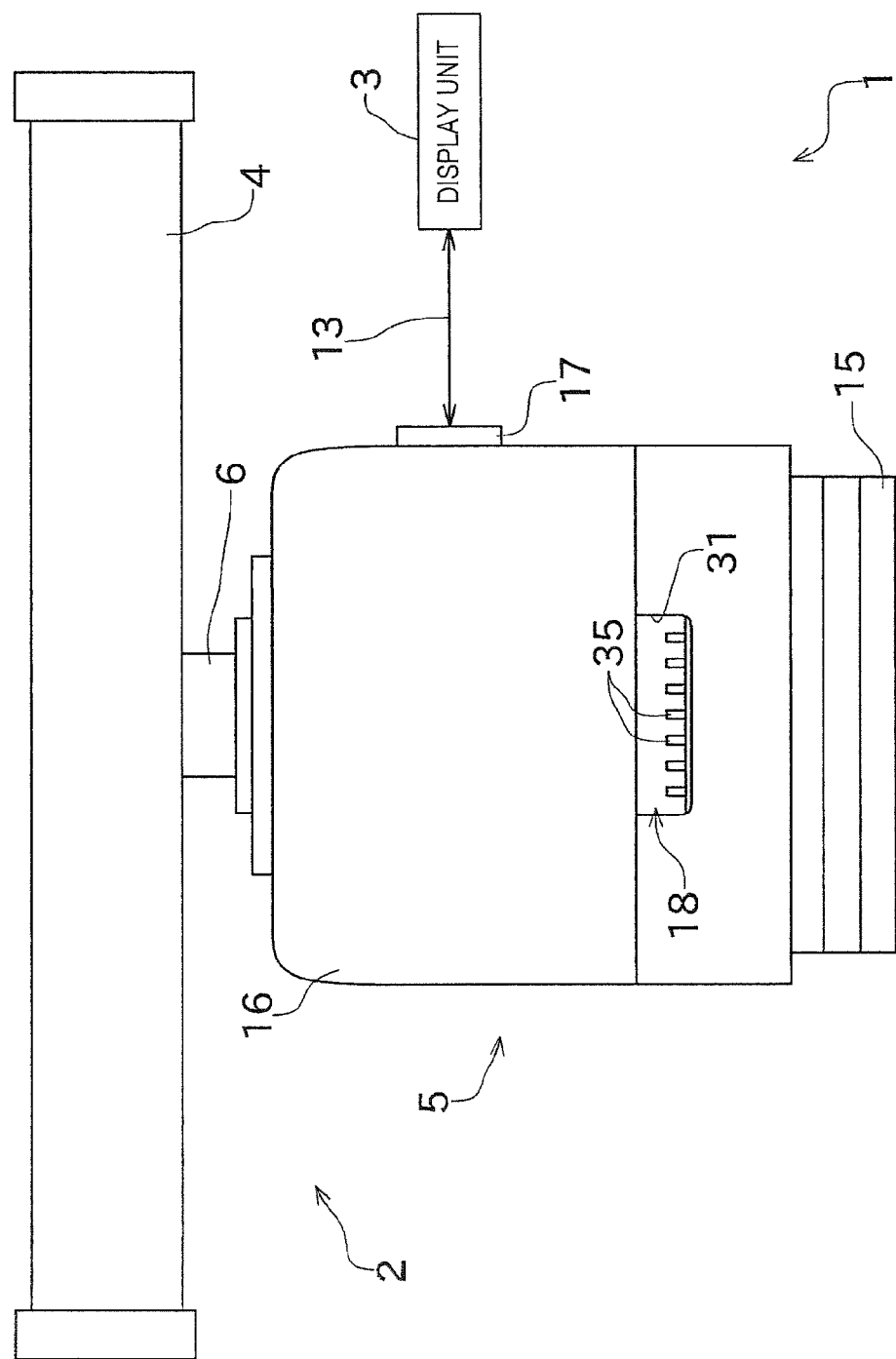
FIG. 1 is a block diagram of a radar apparatus, which also illustrates a front view of a radar antenna according to an embodiment of the present invention.

Next, one embodiment of the present invention is described with reference to the accompanying drawings. FIG. 1 is a block diagram of a radar apparatus 1 according to this embodiment. The radar apparatus 1 of this embodiment is a ship radar to be equipped on a ship. The radar apparatus 1 includes a radar antenna 2 and a display unit 3.

The radar antenna 2 includes an antenna body 4 that is a radiation conductor, and a gear box 5.

The antenna body 4 of this embodiment is configured as a slot array antenna having a sharp directivity. The radar apparatus 1 of this embodiment is a pulse radar, which repeats transception of high-frequency signals by the antenna body 4 while rotatably driving the antenna body 4 at a predetermined rotation cycle.

The gear box 5 includes a rotary drive shaft 6. The antenna body 4 is attached to the rotary drive shaft 6. With a general radar apparatus, the gear box 5 is fixed to a hull so that the axis of the rotary drive shaft 6 is substantially in parallel to the vertical direction. Thus, the antenna body 4 is rotatably driven in the horizontal plane.

Figure 3:
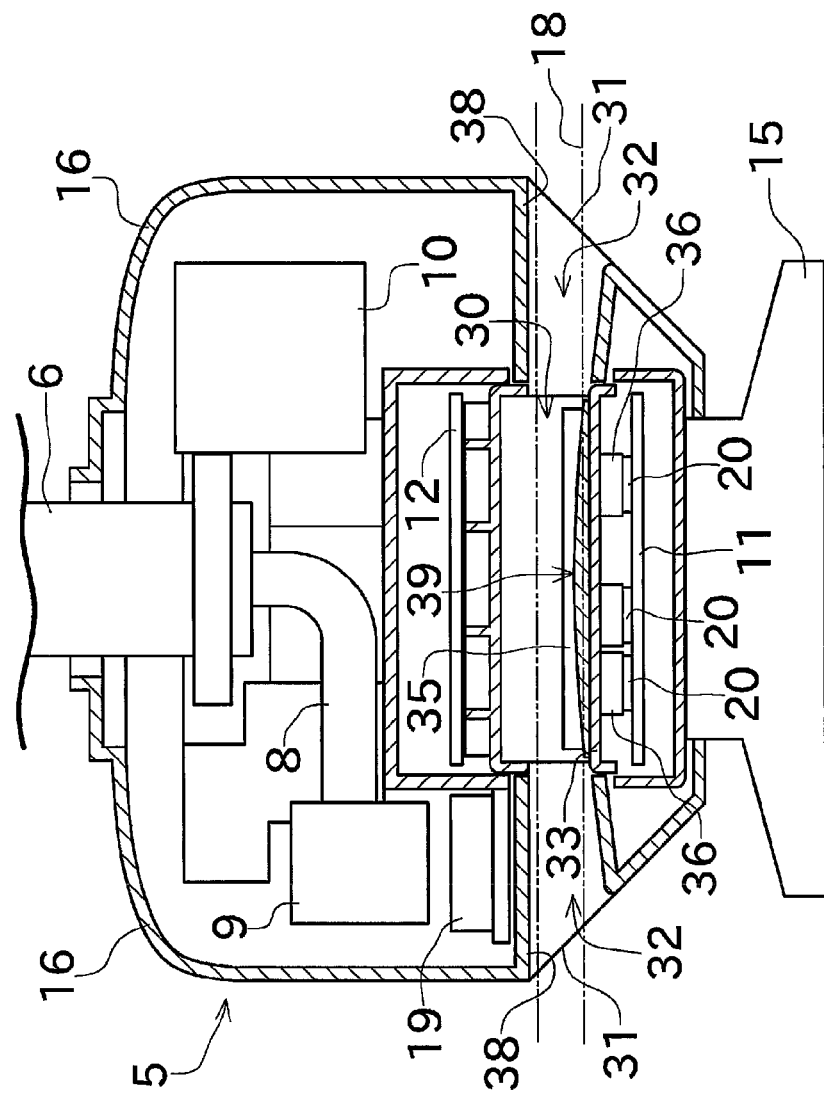
FIG. 3 is a side cross-sectional view of the radar antenna.

As illustrated in FIG. 3, a waveguide 8 is disposed inside the gear box 5 coaxially with the rotary drive shaft 6. Moreover, various components (e.g., a magnetron 9, a drive motor 10, a first circuit board 11, and a second circuit board 12) for controlling the antenna body 4 are disposed inside the gear box 5.

The magnetron 9 is an oscillation element of the radar apparatus 1 and generates a pulse-shaped high-frequency signal. The magnetron 9 applies the high-frequency signal via the waveguide 8. The antenna body 4 transmits the applied high-frequency signal. Moreover, a cooling fan 19 for sending cooling air to the magnetron 9 is provided near the magnetron 9.

The drive motor 10 is a rotary drive source for rotatably driving the rotary drive shaft 6 at a predetermined speed. Thus, the antenna body 4 attached to the rotary drive shaft 6 can be rotated at the predetermined rotation cycle in the horizontal plane.

An electronic circuit for signal processing of the high-frequency signal (reception signal) received by the antenna body 4 is formed in each of the first and second circuit boards 11 and 12. The first circuit board 11 is disposed with elements that easily generate heat and/or is sensitive to heat (easily cause failure due to heat and/or have a possibility of causing thermal runaway) such as CPU and RAM, whereas the second circuit board 12 is disposed with elements that hardly generate heat and is resistant to heat. Hereinafter, the CPU, the RAM and the like on the first circuit board 11 may be referred to as heating elements 20.

The signal processing performed by the first and second circuit boards 11 and 12 includes analog signal processing, such as amplification, demodulation, and A/D conversion of the reception signal, and the reception signal is converted into digital data (reception data) by the signal processing. Moreover, the first and second circuit boards 11 and 12 perform a noise removal on the reception data and a radar image creation based on the data. Thus, the first and second circuit boards 11 and 12 of this embodiment perform a digital operation. The data of the radar image created by the signal processing is sent to the display unit 3 via a communication cable 13. The display unit 3 displays the data received from the first and second circuit boards 11 and 12 as a radar image.

Figure 4:
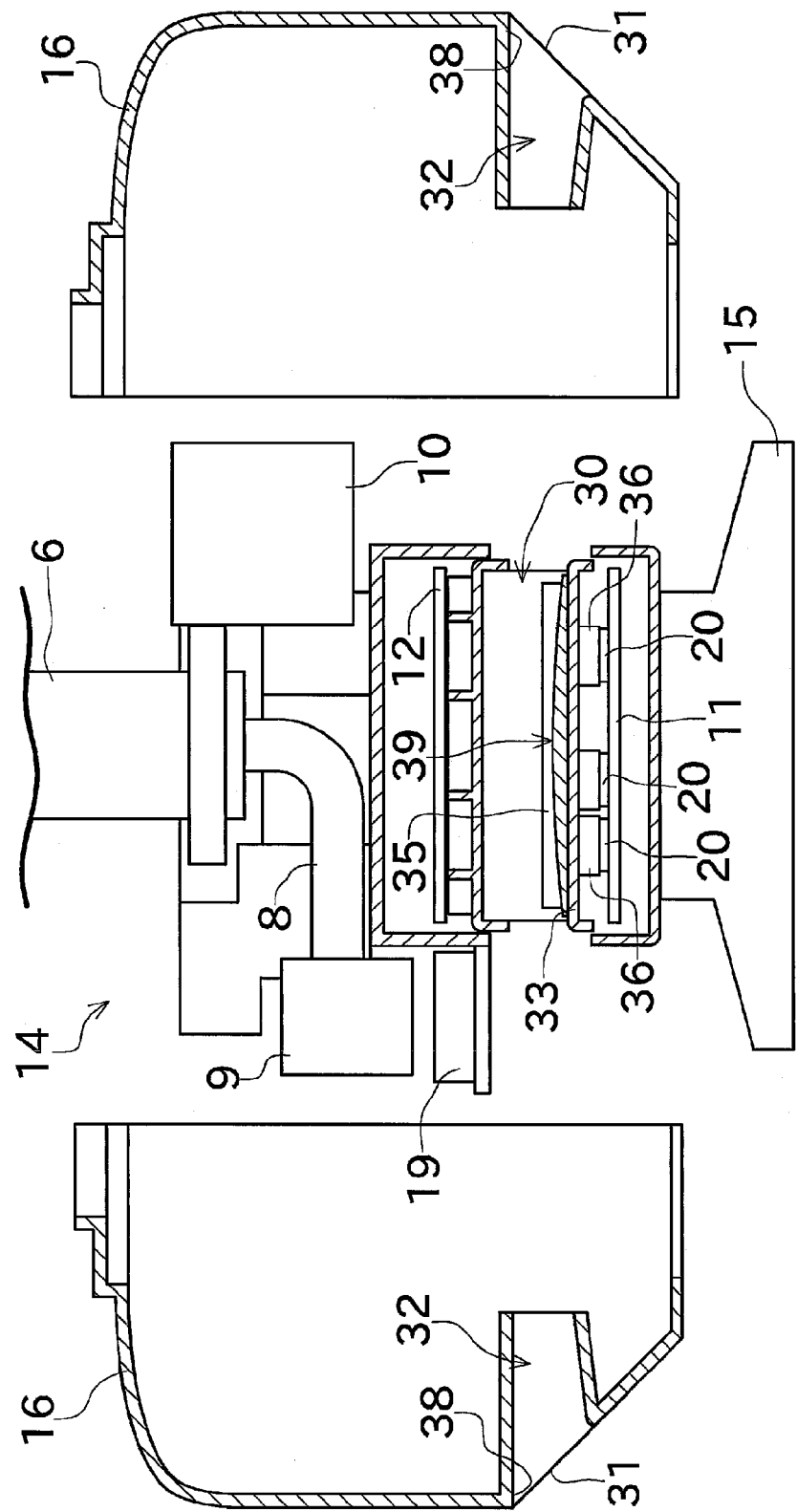
FIG. 4 is a side cross-sectional view illustrating a state of the radar antenna with a housing thereof removed.

As illustrated in FIG. 4, the gear box 5 of this embodiment includes a frame 14 and a base part 15. The base part 15 serves as a foundation of the radar antenna 2. The radar antenna 2 is entirely fixed to the hull by fixing the base part 15 to, for example, a mast of the hull. The frame 14 is made of metal and is fixed to the base part 15. Many of the various components (specifically, the magnetron 9, the drive motor 10, the first and second circuit boards 11 and 12, etc.) for controlling the antenna body 4 are attached to the frame 14.

Figure 5:
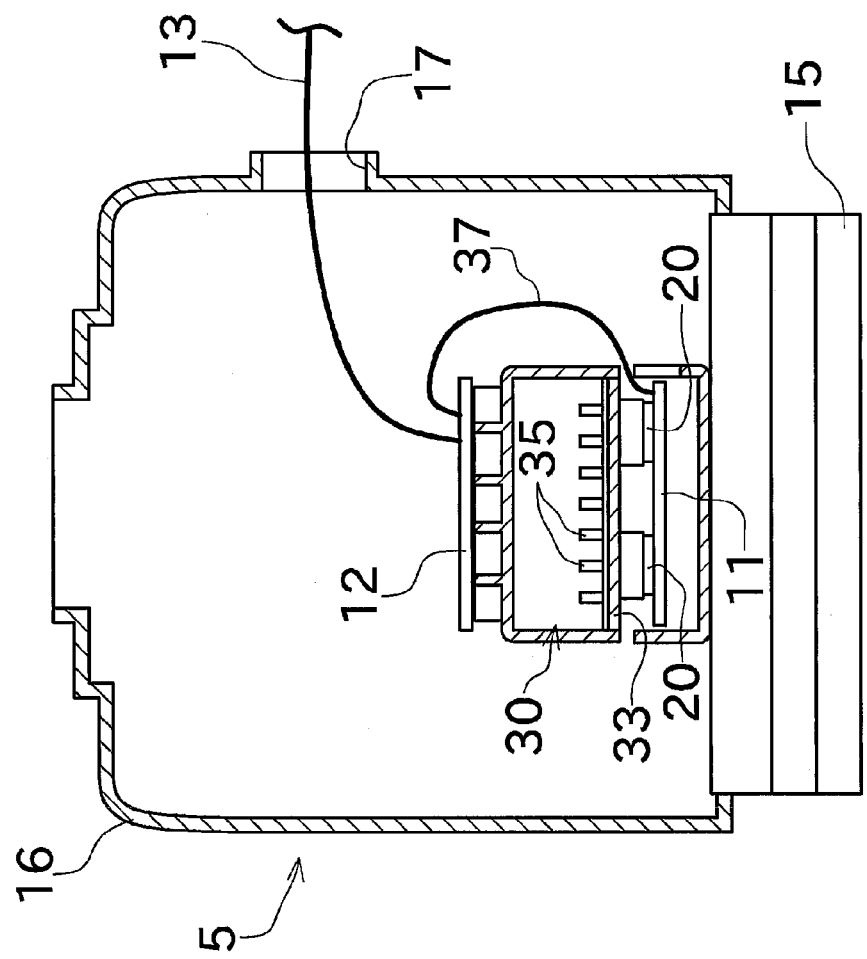
FIG. 5 is a front cross-sectional view illustrating a state of a ventilation part and a circuit board.

Moreover, the gear box 5 includes a housing 16. The housing 16 externally covers the frame 14 and the respective components (specifically, the magnetron 9, the drive motor 10, the first and second circuit boards 11 and 12, etc.). Note that, as illustrated in FIG. 5, the housing 16 is formed with a cable insertion opening 17 for inserting various cables (e.g., the communication cable 13 and a power source cable) therethrough.

The material of the housing 16 is not particularly limited. In this embodiment, since most of the components inside the gear box 5 are attached to the frame 14, the housing 16 only requires some extent of strength. Therefore, a material that is light in weight and can be formed easily, such as plastic, can be adopted as the material of the housing 16.

Subsequently, a characteristic configuration of this embodiment is described.

As described above, the magnetron 9, the drive motor 10 and the like are disposed inside the housing 16 of the gear box 5 of this embodiment. Since these components are also heat generation sources, heat easily accumulates inside the housing 16. Therefore, the cooling fan 19 for cooling the magnetron 9 is provided inside the housing 16. However, if the heat saturates inside the housing 16, a desirable cooling effect by the cooling fan 19 cannot be obtained.

Particularly, in this embodiment, since the first circuit board 11 having the heating elements 20 (e.g., the CPU and the RAM) is disposed inside the housing 16 of the gear box 5, heat accumulates inside the gear box 5 more easily. Since the heating elements 20 (e.g., the CPU and the RAM) of the first circuit board 11 has the characteristic of being sensitive to heat (easily causing failure due to heat and/or having a possibility of causing thermal runaway), a configuration for efficiently releasing heat inside the housing 16 to outside is required.

Thus, the frame 14 of this embodiment has a ventilation section 30 for penetrating the frame 14. The ventilation section 30 is configured as a kind of duct (ventilation tube) and can allow air to pass therethrough. As illustrated in FIG. 5, the ventilation section 30 of this embodiment is formed into a duct-like shape of which the cross-section is a rectangular shape, and is made of metal. The metal ventilation section 30 constitutes a part of the structure of the frame 14. Moreover, as illustrated in FIG. 3, the ventilation section 30 of this embodiment has a linear shape so that air passes therethrough linearly. In the following description, the direction in which air passes inside the ventilation section 30 is referred to as the ventilating direction.

In this embodiment, the ventilation section 30 is arranged to be substantially orthogonal to a direction that is parallel to the axis of the rotary drive shaft 6. Therefore, in a state where the radar antenna 2 is attached to the hull, the ventilating direction is substantially horizontal. The rectangular ventilation section 30 formed into a rectangular duct-like shape has a bottom face 33 that is substantially horizontal in the state where the radar antenna 2 is attached to the hull. The bottom face 33 is provided with fins 35 inside the ventilation section 30 as heat release members.

The housing 16 is formed with a ventilation hole 31 penetrating the housing 16. As illustrated in FIGS. 3 and 4, the ventilation hole 31 is formed to communicate with inside the ventilation section 30 (the section where air passes through).

The housing 16 of this embodiment also has a duct portion 32 connecting the ventilation hole 31 to an entrance portion of the ventilation section 30. The duct portion 32 is formed into a shape corresponding to an end of an opening portion of the ventilation hole 31 pushed toward inside the housing 16 in the ventilating direction. As illustrated in FIG. 1, when seen in the ventilating direction, the opening portion of the ventilation hole 31 is formed substantially into a rectangular shape and, thus, the duct portion 32 is formed substantially into a rectangular duct-like shape. Note that, the ventilation hole 31 and the duct portion 32 are formed in both end portions of the ventilation section 30 in the ventilating direction.

By the ventilation hole 31 and the duct portion 32 of the housing 16 described above, and by the ventilation section 30 of the frame 14, a ventilation path 18 penetrating the gear box 5 is formed. Note that, since each of the ventilation section 30 and the duct portion 32 is formed into the rectangular duct-like shape, it can be said that the ventilation path 18 is entirely formed into a rectangular duct-like shape. Thus, air can pass inside the ventilation path 18.

As described above, the frame 14 is made of metal, and the magnetron 9, the drive motor 10 and the like are attached to the frame 14. The heat from the magnetron 9 and the drive motor 10 is transmitted to the ventilation section 30 by the metal frame 14. Since air flows into the ventilation section 30 by passing the air inside the ventilation path 18, the heat from the magnetron 9, the drive motor 10 and the like can be released from the ventilation section 30 into the atmosphere.

Moreover, the first and second circuit boards 11 and 12 are both arranged inside the gear box 5 so as to be substantially horizontal. The first circuit board 11 is arranged below the ventilation section 30 to be parallel to the bottom face 33. Heat transmitting members 36 are provided between the heating elements 20 (e.g., the CPU and the RAM) and an outer circumferential surface of the bottom face 33 of the ventilation section 30.

With the above configuration, the heat from the heating elements 20 on the first circuit board 11 can be efficiently transmitted to the ventilation section 30. Therefore, the heating elements 20 can efficiently be cooled down, and the failure and the thermal runaway of the heating elements 20 can be prevented. Particularly, in this embodiment, since the fins 35 are provided to the bottom face 33 of the ventilation section 30, the heat from the heating elements 20 can be released from the fins 35. Thus, the cooling efficiency of the heat generating elements 20 on the first circuit board 11 further improves.

Note that, in view of releasing the heat inside the housing 16 into the atmosphere, for example, it may also be considered to provide fins for releasing heat to an outer face of the housing. However, in this case, work of attaching the fins to the outer face of the housing 16 will be required. Moreover, in the case of providing the fins to the outer face of the housing 16, the heat generating sources (e.g., the magnetron 9 and the drive motor 10) are required to be attached to the housing 16 from the inside, and the gear box 5 becomes extremely difficult to assemble.

In this regard, the radar antenna 2 of this embodiment does not require providing heat releasing members, such as the fins, to the housing 16. Thus, the heat generating sources are not required to be attached to the housing 16. Therefore, the housing 16 may be attached at last after attaching the respective components (including the heat generating sources, such as the magnetron 9, the drive motor 10, and the first circuit board 11) to the frame 14. With the configuration of this embodiment, the assembling work of the gear box 5 can be performed efficiently and the assembling performance is high.

As illustrated in FIG. 4, the housing 16 is divided into two in the ventilating direction. The housing 16 is attached to the frame 14 in a manner that it interposes the frame 14 therebetween. Since the ventilation section 30 of the frame 14 is covered by the housing 16 to be arranged inside the housing 16, the visibility of the ventilation section 30 from outside is low. Thus, degradation of the design due to the duct-like ventilation section 30 being exposed outside can be prevented.

The radar antenna 2 of this embodiment is fixed to the hull so that the ventilating direction is parallel to front-and-rear directions of the hull. Thus, the wind produced by the traveling of the ship can efficiently pass through the ventilation path 18.

Figure 2:
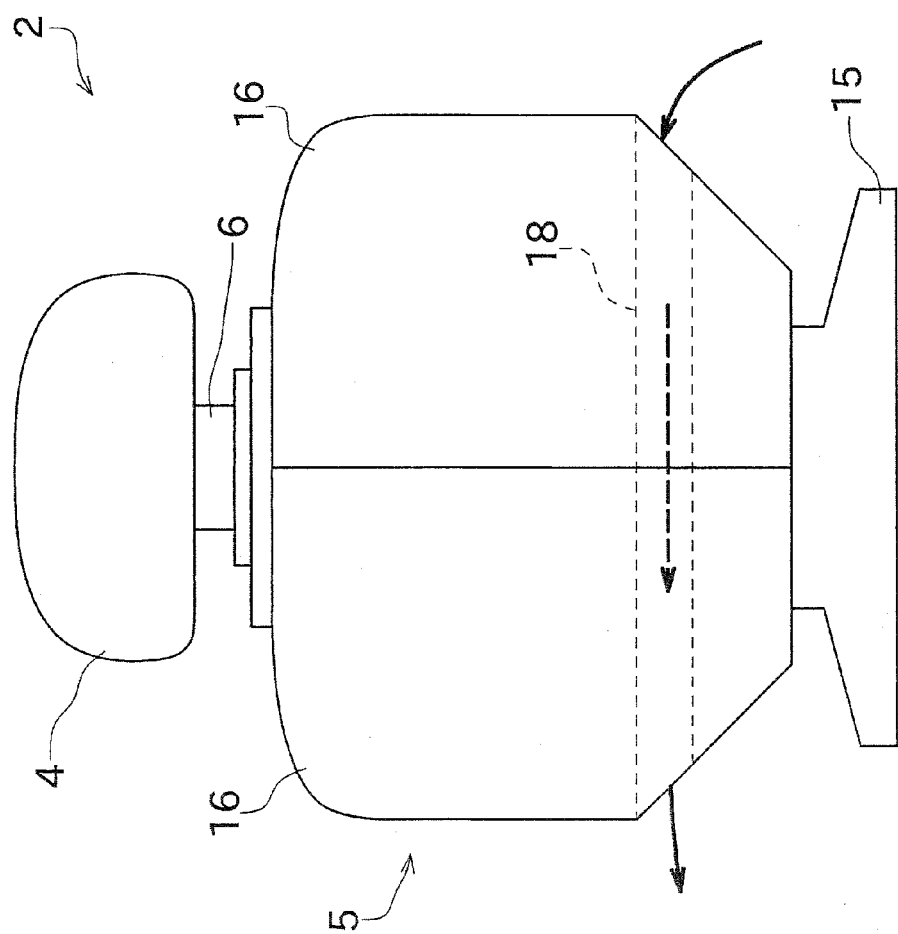
FIG. 2 is a side view of the radar antenna.

As illustrated in FIG. 3, in the housing 16, an overhanging portion 38 protruding outward in the ventilating direction is formed in an upper area of the ventilation hole 31. Thus, the wind blown up from below can be guided into the ventilation path 18 as indicated by the thick arrow in FIG. 2. Thereby, wind can pass through the ventilation path 18 more efficiently. Therefore, the heat release efficiency can further be improved.

Note that, the bottom face 33 of the ventilation section 30 is formed with a bulged part 39 of which the center portion in the ventilating direction bulges upward. Thus, the bottom face 33 of the ventilation section 30 is formed to incline lower toward the ends thereof in the ventilating direction. Moreover, the bottom face of the duct portion 32 of the housing 16 is also formed to incline lower toward the ends thereof in the ventilating direction. Since the bottom face of the entire ventilation path 18 inclines outward as above, water entered inside the ventilation path 18 (e.g., rain) can be drained outside.

As illustrated in FIG. 3, the heat generating sources (specifically the magnetron 9 and the drive motor 10) other than the heating elements 20 (e.g., the CPU and the RAM) are disposed above the ventilation section 30. On the other hand, the first circuit board 11 is disposed below the ventilation section 30. More specifically, when seen from the direction orthogonal to the axial direction of the rotary drive shaft 6 and the ventilating direction (FIG. 3), the heating elements 20 are disposed on the opposite side from the heat generating sources other than the heating elements 20 with respect to the ventilation section 30 (and the extending line along the ventilating direction) therebetween.

As described above, the first circuit board 11 is disposed to be separated from the magnetron 9 and the drive motor 10 with respect to the ventilation path 18 therebetween. Thus, since the transmission of the heat from the magnetron 9 and the drive motor 10 to the first circuit board 11 can be blocked by the ventilation section 30, the heat from the magnetron 9 and the drive motor 10 does not easily influence the heating elements 20 on the first circuit board 11. Therefore, the failure and thermal runaway of the heating elements 20 due to heat can be effectively prevented.

Note that, when seen from the ventilation section 30, the second circuit board 12 is disposed on the same side as the magnetron 9 and the drive motor 10 (above the ventilation section 30). Since elements which are sensitive to heat are not disposed on the second circuit board 12, the second circuit board 12 can be disposed near the magnetron 9 and the drive motor 10. As illustrated in FIG. 3, the second circuit board 12 is arranged above a top face of the ventilation section 30 to be parallel thereto.

Note that, the magnetron 9, the waveguide 8, the drive motor 10 and the like are all disposed in an upper part of the gear box 5. This is because the antenna body 4 is disposed above the gear box 5. By disposing the ventilation section 30 below the magnetron 9, the waveguide 8, and the drive motor 10, the ventilation section 30 can be separated from the magnetron 9, the waveguide 8, and the drive motor 10, and a reasonable layout is obtained.

Moreover, as illustrated in FIG. 5, a space where a communication cable 37 connecting between the first and second circuit boards 11 and 12 is wired is secured. The communication cable 37 is wired to go around the ventilation section 30. The first and second circuit boards 11 and 12 communicate information therebetween by using the communication cable 37, and the signal processing can be performed appropriately.

As described above, the radar antenna 2 of this embodiment includes the antenna body 4, the housing 16, and the ventilation path 18. The housing 16 accommodates the plurality of components for controlling the antenna body 4. The ventilation path 18 is formed in the predetermined ventilating direction and penetrates the housing 16. Moreover, one or more of the plurality of components are disposed to be separated from the other components with respect to them ventilation path therebetween.

By forming the ventilation path 18 penetrating the housing 16, the heat from the components disposed inside the housing 16 can be released efficiently. Heat release members are not required to be attached outside the housing 16. Therefore, the assembling of the radar antenna 2 becomes easy. Moreover, by separately disposing the plurality of components with respect to the ventilation path 18 therebetween, heat from one or more of the plurality of components is not easily transmitted to the other components disposed separately. Thus, the components sensitive to heat can be protected.

Although, the preferred embodiment of the present invention is described above, the above configuration may be modified as follows, for example.

The radar apparatus of the present invention is not limited to the ship radar apparatus, but may also be suitably applied to different kinds of radar apparatus.

In the above embodiment, the heating elements 20 (e.g., the CPU and the RAM) is disposed to be separated from the heat generating sources (the magnetron 9 and the drive motor 10) other than the heating elements 20, with respect to the ventilation path 18 therebetween. However, for the purpose of preventing the heat from the heat generating bodies from influencing other components, as long as one or more components disposed on one of the sides with respect to the ventilation path 18 therebetween are heat generating bodies, one or more components disposed on the other side are not necessarily heat generating bodies. For example, by disposing the heat generating bodies separately from non-heat generating bodies with respect to the ventilation section 30 therebetween, the non-heat generating bodies can effectively be prevented from being influenced by heat from the heat generating bodies.

The ventilation path 18 is formed into the rectangular duct-like shape; however, it may be a circular duct-like shape, for example.

In the above embodiment, the first and second circuit boards 11 and 12 are provided as circuit boards for the signal processing; however, without limiting to this, two circuit boards are not necessarily be provided if the circuit for the signal processing can be assembled on one circuit board. Alternatively, three or more circuit boards may suitably be disposed inside the gear box 5.

The ventilation path 18 may include a plurality of paths. Moreover, the direction of the ventilation path 18 is not necessarily parallel to the traveling direction of the ship.

The fins 35 inside the ventilation section 30 may be omitted.

In the above embodiment, the heat releasing members, such as the fins, are not provided to the housing 16; however, without limiting to this, one or more heat releasing members may be provided to the housing 16 as needed.

The oscillation element is not limited to the magnetron, but may be a semiconductor. In this case, the cooling fan 19 provided to cool the magnetron 9 in the above embodiment will be not required. Moreover, a periodic exchange of the magnetron 9 and the cooling fan 19 will not be required. Thus, a radar antenna that is excellent in maintainability can be accomplished.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. A radar antenna configured for use on a ship, comprising:
   an antenna body;
   a housing accommodating a plurality of components for controlling the antenna body; and
   a ventilation path formed in a predetermined ventilating direction and penetrating the housing, the ventilation path being arranged so that the ventilating direction is substantially horizontal and parallel to front-and-rear directions of the ship,
   wherein one or more of the plurality of components are disposed inside the housing to be separated from the rest of the components with respect to the ventilation path therebetween, such that one or more of the plurality of components are disposed above the ventilation path and one or more of the plurality of components are disposed below the ventilation path,
   wherein a floor face of the ventilation path inclines to be lower on one end side thereof.

2. The radar antenna of claim 1, wherein the plurality of components include a heat generating body and one or more non-heat generating bodies, and
   wherein the heat generating body is disposed separately from at least one of the one or more non-heat generating bodies with respect to the ventilation path therebetween.

3. The radar antenna of claim 1, wherein the plurality of components at least include a first heat generating body and a second heat generating body, and
   wherein the first heat generating body is disposed separately from the second heat generating body with respect to the ventilation path therebetween.

4. The radar antenna of claim 3, wherein the first heat generating body is an oscillation element, and the second heat generating body is a heating element disposed on a circuit board for signal processing.

5. The radar antenna of claim 4, wherein the ventilation path is formed into a rectangular duct-like shape, and
   wherein the circuit board is disposed parallel to an outer circumferential surface of the rectangular duct-like ventilation path.

6. The radar antenna of claim 1, further comprising a frame to which the plurality of components are attached,
   wherein the ventilation path includes:
      a ventilation section formed by the frame; and
      a ventilation hole formed in the housing and communicating with the ventilation section.

7. The radar antenna of claim 1, wherein the ventilation path is disposed below an oscillation element, a waveguide, and a rotary drive source of the antenna body.

8. The radar antenna of claim 1, further comprising a display unit for displaying a radar image based on signals received by the radar antenna.

9. The radar antenna of claim 8, wherein the plurality of components include a heat generating body and one or more non-heat generating bodies, and
   wherein the heat generating body is disposed separately from at least one of the one or more non-heat generating bodies with respect to the ventilation path therebetween.

10. The radar antenna of claim 8, wherein the plurality of components at least include a first heat generating body and a second heat generating body, and
    wherein the first heat generating body is disposed separately from the second heat generating body with respect to the ventilation path therebetween.

11. A radar antenna configured for use on a ship, comprising:
    an antenna body;
    a housing accommodating a plurality of components for controlling the antenna body; and
    a ventilation path formed in a predetermined ventilating direction and penetrating the housing, the ventilation path being arranged so that the ventilating direction is substantially horizontal and parallel to front-and-rear directions of the ship,
    wherein one or more of the plurality of components are disposed inside the housing to be separated from the rest of the components with respect to the ventilation path therebetween, such that one or more of the plurality of components are disposed above the ventilation path and one or more of the plurality of components are disposed below the ventilation path, wherein the housing has an overhanging portion protruding outward in the ventilating direction, near an upper area of an inlet of the ventilation path.

12. The radar antenna of claim 11, wherein the plurality of components include a heat generating body and one or more non-heat generating bodies, and
wherein the heat generating body is disposed separately from at least one of the one or more non-heat generating bodies with respect to the ventilation path therebetween.

13. The radar antenna of claim 11, wherein the plurality of components at least include a first heat generating body and a second heat generating body, and
wherein the first heat generating body is disposed separately from the second heat generating body with respect to the ventilation path therebetween.

14. The radar antenna of claim 13, wherein the first heat generating body is an oscillation element, and the second heat generating body is a heating element disposed on a circuit board for signal processing.

15. The radar antenna of claim 14, wherein the ventilation path is formed into a rectangular duct-like shape, and
wherein the circuit board is disposed parallel to an outer circumferential surface of the rectangular duct-like ventilation path.

16. The radar antenna of claim 11, further comprising a frame to which the plurality of components are attached,
wherein the ventilation path includes:
a ventilation section formed by the frame; and
a ventilation hole formed in the housing and communicating with the ventilation section.

17. The radar antenna of claim 11, wherein the ventilation path is disposed below an oscillation element, a waveguide, and a rotary drive source of the antenna body.

18. The radar antenna of claim 11, further comprising a display unit for displaying a radar image based on signals received by the radar antenna.

19. The radar antenna of claim 18, wherein the plurality of components include a heat generating body and one or more non-heat generating bodies, and
wherein the heat generating body is disposed separately from at least one of the one or more non-heat generating bodies with respect to the ventilation path therebetween.

20. The radar antenna of claim 18, wherein the plurality of components at least include a first heat generating body and a second heat generating body, and
wherein the first heat generating body is disposed separately from the second heat generating body with respect to the ventilation path therebetween.

* * * * *